United States Patent [19]
Nelson

[11] Patent Number: 5,247,245
[45] Date of Patent: Sep. 21, 1993

[54] APPARATUS FOR TESTING DIFFERENT ELECTRICAL SENSORS

[76] Inventor: Bruce D. Nelson, 19878 E. Cornell Ave., Aurora, Colo. 80013

[21] Appl. No.: 804,910

[22] Filed: Dec. 6, 1991

[51] Int. Cl.⁵ .................. G01R 19/14; G01R 31/02
[52] U.S. Cl. .................. 324/133; 324/537; 324/556
[58] Field of Search .......... 324/537, 546, 556, 555, 324/133, 72.5, 149, 73.1, 202, 226; 340/660, 661, 663, 665, 635, 653, 643, 654, 656; 73/1 R, 1 D

[56] References Cited

U.S. PATENT DOCUMENTS

| | | | |
|---|---|---|---|
| 3,416,074 | 12/1968 | Schoonover | 324/133 |
| 3,525,939 | 8/1970 | Cartmell | 324/133 |
| 3,757,218 | 9/1973 | Oliverio et al. | 324/156 |
| 4,002,972 | 1/1977 | Konrad et al. | 324/73 R |
| 4,027,236 | 5/1977 | Stewart | 324/556 |
| 4,084,134 | 4/1978 | Nagano | 324/133 |
| 4,171,512 | 10/1979 | Tsuda | 324/133 |
| 4,205,264 | 5/1980 | Gold | 324/556 |
| 4,207,610 | 6/1980 | Gordon | 364/580 |
| 4,259,635 | 3/1981 | Triplett | 324/149 |
| 4,298,837 | 11/1981 | Koslar | 324/72.5 |
| 4,574,276 | 3/1986 | Sato | 340/661 |
| 4,634,971 | 1/1987 | Johnson et al. | 324/133 |
| 4,724,382 | 2/1988 | Schauerte | 324/133 |
| 4,859,932 | 8/1989 | Whitley | 324/72.5 |
| 4,950,997 | 8/1990 | Austin et al. | 324/133 X |

FOREIGN PATENT DOCUMENTS 212925 1/1961 Austria .................. 324/149

Primary Examiner—Walter E. Snow
Attorney, Agent, or Firm—John R. Flanagan

[57] ABSTRACT

An apparatus for testing different electrical sensors used in machinery includes first, second and third insulated conductors, a grounded connection, a power supply, a low signal detector, a high signal detector, a varying signal detector, and an indicator. The first and second conductors are connectible to sensor under test to respectively conduct ground and supply voltage signals to the sensor. The third conductor is connectible to the sensor under test to conduct an input voltage signal from the sensor to the low, high and varying signal detectors. The low signal detector compares the input voltage signal with a low voltage reference signal. The high signal detector compares the input voltage signal with a high voltage reference signal. The varying signal detector compares the input voltage signal with a positive voltage reference signal. The low, high and varying signal detectors produce output signals of either first or second states which are received by the indicator. In response to any one of the output signals being of the first state, the indicator assumes a first condition indicating that the operation of the sensor under test is satisfactory. In response to all output signals being of the second state, the indicator assumes a second condition indicating that the operation of the sensor under test is unsatisfactory.

9 Claims, 7 Drawing Sheets

APPARATUS FOR TESTING DIFFERENT ELECTRICAL SENSORS

BACKGROUND OF THE INVENTION

Field of the Invention

The present invention generally relates to testing sensors and, more particularly, to a sensor testing apparatus for testing a wide variety of different sensors used on electronically-controlled machinery.

Description of the Prior Art

Most sophisticated farm and industrial machinery in widespread use at the present time employ a wide variety of different sensors to constantly monitor various components of the machinery to ensure proper operation. In the case of farm machinery, some examples of operations these sensors monitor are as follows: component rotation, grain level, grain loss, and seed count. These sensors fall into the following four general categories: magnetic, photoelectric, impact and proximity.

Magnetic sensors are used to sense rotation of toothed target wheels, gears, and shafts, and will have two wires for supply voltage and ground. The target may be a magnet, or just plain metal. A magnetic sensor that picks up the movement of a plain metal object will have a magnet built into it, whereas one that uses a magnet for a target will not have a built-in magnet.

Photoelectric sensors are used to detect grain level in combine graintanks and to count seeds falling through seed tubes on planters. Most of these sensors are self-contained, with the light source and detector housed in the same module. The light source may be visible or invisible infrared, but the operation of all photoelectric sensors depends on detecting an interruption of the light beam between the source and the detector target. These sensors have three wires for supply voltage, signal, and ground.

Impact sensors are used to detect grain loss in combines and also are used in automatic stone traps. They may have two or three wires depending on whether or not an amplifier is built into the sensor. Proximity sensors are also known as Hall Effect sensors. These sensors, used in automatic metal detectors, change their electrical characteristics when exposed to a magnet. Usually they have three wires for supply voltage, signal and ground.

Over the years, electrical circuit testing devices of many different designs have been proposed in the prior patent art. Representative prior art devices are the ones disclosed in U.S. Patents to Oliverio et al (U.S. Pat. No. 3,757,218), Konrad et al (U.S. Pat. No. 4,002,972), Stewart (U.S. Pat. No. 4,027,236), Nagano (U.S. Pat. No. 4,084,134), Gold (U.S. Pat. No. 4,205,264), Gordon (U.S. Pat. No. 4,207,610), Triplett (U.S. Pat. No. 4,259,635), Koslar (U.S. Pat. No. 4,298,837), Schauerte (U.S. Pat. No. 4,724,382) and Whitley (U.S. Pat. No. 4,859,932). While these prior art devices probably function satisfactorily under the limited range of conditions for which they were intended, they do not have sufficient versatility to be applicable to the above-described different categories of sensors being utilized at the present time.

Consequently, a need exists for a sensor testing apparatus of substantially universal applicability to the primary categories of the sensors in use today.

SUMMARY OF THE INVENTION

The present invention provides sensor testing apparatus designed to satisfy the aforementioned need. The sensor testing apparatus of the present invention makes it possible to quickly and easily test all sensors of the aforementioned general categories being used at the present time on most farm and industrial machinery, thereby greatly facilitating troubleshooting and repair.

Accordingly, the present invention is directed to sensor testing apparatus for testing a variety of different electrical sensors. The testing apparatus comprises: (a) means for providing a signal at ground voltage; (b) means connected to the providing means and connectible to a sensor under test for conducting the ground voltage signal to the sensor under teat; (c) means for supplying a signal at a positive supply voltage; (d) means connected to the supplying means and connectible to the sensor under test for conducting the positive supply voltage signal to the sensor under test; (e) means connectible to the sensor under test for receiving and conducting an input voltage signal from the sensor under test; (f) means connected to the input voltage signal conducting means for receiving the input voltage signal, comparing the input voltage signal to a first reference signal at a low voltage and to a second reference signal at a high voltage, and producing an output signal of a first state when the input voltage signal is less in magnitude than the low voltage reference signal or greater in magnitude than the high voltage reference signal and producing another output signal of a second state when the input voltage signal is greater in magnitude than the low voltage reference signal and less in magnitude than the high voltage reference signal; and (g) means for indicating a first condition when the operation of the sensor under test is satisfactory and a second condition when the operation of the sensor under test is unsatisfactory, the indicating means being connected to the receiving and comparing means for receiving the output signal therefrom and indicating the first condition when the output signal is of the first state and indicating the second condition when output signal is of the second state.

Also, the apparatus includes another means connected to the input voltage signal conducting means for receiving the input voltage signal, comparing the input voltage signal to a positive voltage reference signal, and producing another output signal of a first state when the input voltage signal is a train of individual pulses and the individual pulses are greater in magnitude than the positive voltage reference signal and of a second state when the individual pulses are less in magnitude than the positive voltage reference signal.

Further, the indicating means includes a light emitting diode which in the first condition is turned on in response to receiving the output signal of the first state and which is the second condition is turned off in response to receiving the output signal of the second state. Also, means is connected between each of the receiving and comparing means and the light emitting diode for receiving and amplifying the output signals to provide maximum brightness of the light emitting diode when any of the output signals is of the first state in which the light emitting diode is turned on.

More particularly, the plurality of receiving and comparing means include a low level detector, a high level detector, and a varying level or pulse detector. Each of the detectors includes an operational amplifier having one input connected to the input voltage signal, the other input connected respectively to low, high and positive voltage reference signals, and an output connected to the indicating means.

The testing apparatus also includes an on/off switch connected between the supply voltage signal supplying means and the supply voltage signal conducting means. The switch is operable between "on" and "off" positions to respectively connect the supply voltage signal supplying means to or disconnect the supply voltage signal supplying means from the supply voltage signal conducting means. Further, an indicator means is connected to the on/off switch for indicating whether the on/off switch is in the "on" or "off" position.

These and other features and advantages of the present invention will become apparent to those skilled in the art upon a reading of the following detailed description when taken in conjunction with the drawings wherein there is shown and described illustrative embodiments of the invention.

BRIEF DESCRIPTION OF THE DRAWINGS

In the following detailed description, reference will be made attached drawings in which:

FIG. 3 is pictorial view of a hand-held embodiment of sensor testing apparatus incorporating the components depicted in the schematic circuit diagram of FIG. 2.

DETAILED DESCRIPTION OF THE INVENTION

Figure 1:
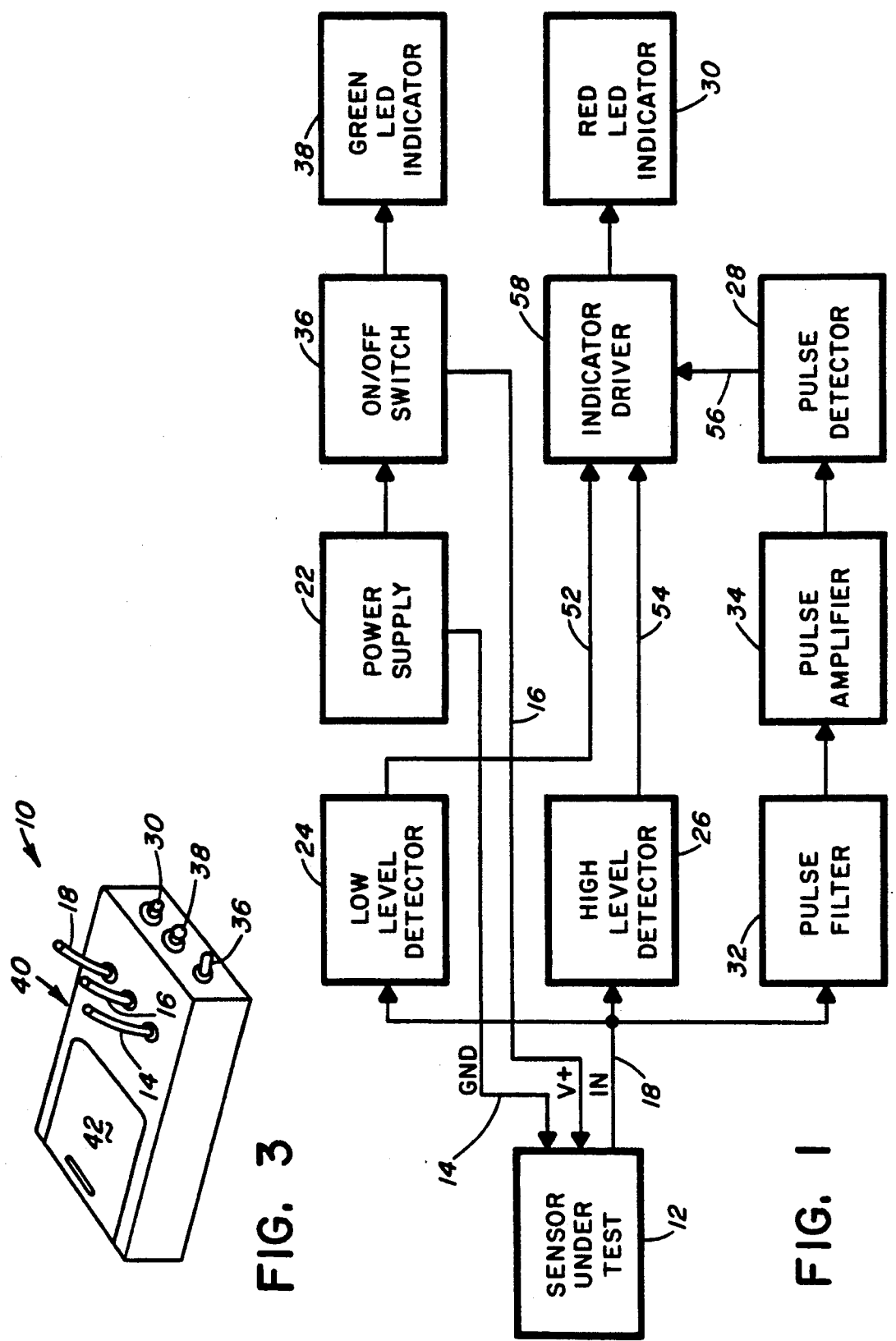
FIG. 1 is a general block diagram of sensor testing apparatus of the present invention, being shown interfaced with a sensor under test.
Figure 2:
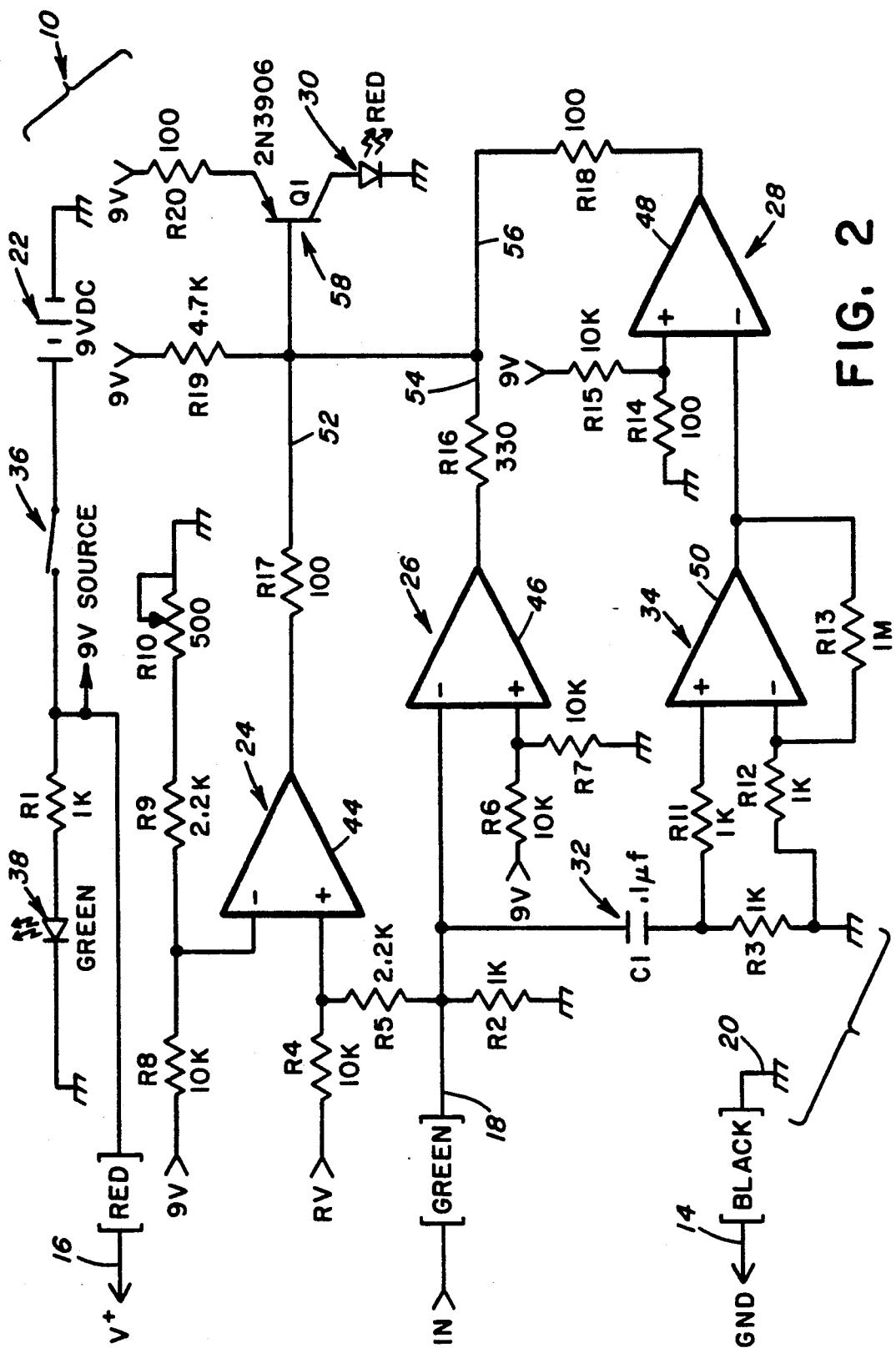
FIG. 2 is an electrical schematic circuit diagram of the sensor apparatus of FIG. 1.

Referring to the drawings, and particularly to FIGS. 1-3, there is illustrated sensor testing apparatus, generally designated 10, of the present invention. The sensor testing apparatus 10 is designed for use in testing a sensor 12, such as any one of the general categories of sensors—magnetic, photoelectric, impact and proximity—in widespread use at the present time on most farm and industrial machinery.

Basically, the sensor testing apparatus 10 includes first, second and third insulated conductors 14, 16, 18, a grounded connection 20, a power supply 22, a low level signal detector 24, a high level signal detector 26, a pulse (or regularly varying level) signal detector 28, and a first indicator 30. Also, the testing apparatus 10 includes a pulse filter 32 and a pulse amplifier 34. Further, the testing apparatus 10 includes an on/off switch 36 and a second indicator 38.

In a hand-held implementation of the testing apparatus 10 shown in FIG. 3, a metal or plastic housing 40 is provided to contain the above components. The first, second, and third insulated conductors 14, 16, 18 which extend from the housing 40 provide test leads for connecting to the sensor 12 under test. Their outer insulating coverings are preferably respectively colorcoded black, red and green to facilitate identification. The black first conductor 14 provides a signal at ground voltage level to the sensor 12 under test. The green second conductor 16 is used to receive the output of the sensor 12 under test or, in other words, an input signal to the testing apparatus 10. The red third conductor 18 provides a supply voltage level signal to the sensor 12 under test when required.

The first and second indicators 30, 38 and on/off switch 36 are mounted in a series of holes provided in one end of the housing 40 so that they are accessible from the exterior of the housing 40 and connected to the other components contained within the housing. The indicators 30, 38 are preferably light emitting diodes (LEDs) having different colors. By way of example, the first indicator 30 can be red, while the second indicator 38 can be green. A removable cover 42 provided on a lower portion of the housing 40 encloses an interior compartment which contains the power supply 22. Preferably, the power supply 22 is a small nine-volt D.C. battery.

More particularly, the black first insulated conductor 14 of the testing apparatus 10 is connected to the connection or terminal 20 which is suitably grounded. The grounded terminal 20 provides a signal GND at ground voltage or potential. Also, the first conductor 14 is connectible by a suitable clip, probe or connector (not shown) to the sensor 12 under test for conducting the ground voltage signal GND thereto.

The red second insulated conductor 16 of the testing apparatus 10 is connected to the power supply 22 so as to receive a positive supply voltage signal V+ therefrom. Also, the second conductor 16 is connectible by a suitable clip, probe or connector (not shown) to the sensor 12 under test for conducting the positive supply voltage signal V+ thereto. The power supply 22 of the testing apparatus 10 provides the positive supply voltage signal V+ to power the sensor 12 under test where that is required, as well as to power the other components of the testing apparatus 10 via the various terminals being labelled as "9V" in FIG. 2.

The on/off switch 36 of the testing apparatus 10 is connected between the second conductor 16 and the power supply 22. Preferably, the switch 36 is a toggle-type device which, upon being moved between "on" and "off" positions, functions to respectively turn on and off the electrical power to the components of the testing apparatus 10 and to the second conductor 16. The green second LED indicator 38 is illuminated when the power is switched on and the testing apparatus 10 is operating satisfactorily. Also, as seen in FIG. 2, the green second LED indicator 38 is biased by a resistor R1 connected in series between it and the on/off switch 36 so that the illumination provided by the indicator 38 will dim if the supply voltage signal V+from the power supply 22 is low. The illumination from the LED indicator 38 will go out completely if the first and second conductors 14, 16 are shorted to each other or if connected to a shorted sensor 12 to be tested.

The green third insulated conductor 18 of the testing apparatus 10 is connectible to the sensor 12 under test for receiving and conducting an input voltage signal IN therefrom to the testing apparatus 10. The low level signal detector 24, high level signal detector 26, and pulse signal detector 28 of the testing apparatus 10 all connected in parallel to the third conductor 18 receive the same input voltage signal IN from the sensor 12 under test via the third conductor 18.

The low level detector 24, high level detector 26, pulse detector 28, and pulse amplifier 34 are sections of a commercially-available quad operational amplifier integrated circuit module identified by the product designation LM324. Each of these components includes separate operational amplifiers 44, 46, 48 and 50, each having a pair of positive and negative inputs and an output. The pulse filter 32 is a capacitor C1, shown in FIG. 2. Resistors R2 through R15 arranged in various voltage divider and other networks are connected with these components of the integrated circuit module, as shown in FIG. 2. These components plus the pulse filter 32 function together to test the input voltage signal IN from the sensor 12 under test and drive the red first LED indicator 30 on or off in response thereto.

The input voltage signal IN is applied to the positive terminal of the operational amplifier 44 of the low level detector 24 via a resistive voltage divider network formed by resistors R2, R4 and R5. The divided down input voltage signal IN is compared by the op amp 44 to a low voltage level reference signal S1 established at the negative input of the op amp 44 by a resistive voltage divider network formed by resistors R8, R9 and R10. If the voltage level of signal IN approaches ground level, the voltage at the positive input of the op amp 44 will decrease until it eventually reaches a magnitude or level that is less than the level of the low voltage reference signal S1 applied to the negative input of the op amp 44. At this point, the output of the op amp 44 switches from a high state to a low state. Conversely, when the level of the signal IN applied at the positive input increases above the level of the reference signal S1 applied to the negative input, then the output of the op amp 44 switches from the low state back to the high state.

The input voltage signal IN is also applied to the negative terminal of the operational amplifier 46 of the high level detector 26. The input voltage signal IN is compared by the op amp 46 to a high voltage level reference signal S2 established at the positive terminal of the op amp by a resistive voltage divider network formed by resistors R6 and R7. If the voltage level of signal IN approaches the supply voltage level, the voltage at the negative input of the op amp 46 will increase until it eventually reaches a magnitude or level that is more than the level of the high voltage reference signal S2 applied to the positive input of the op amp 46. At this point, the output of the op amp 46 switches from a high state to a low state. Conversely, when the level of the signal IN applied at the negative input decreases below the level of the reference signal S2 applied to the positive input, then the output of the op amp 46 switches from the low state back to high state.

The input voltage signal IN is further applied to the negative terminal of the operational amplifier 48 of the pulse detector 28 after processing by the pulse filter (capacitor C1) 32 and pulse amplifier 34. If the input voltage signal IN is a train of pulses, it will not activate either the low or high level detectors 24, 26. The pulse train passes through the coupling capacitor C1, being the pulse filter 32, where any D.C. voltage offset is removed. The pulse train is then applied through a resistive voltage divider network formed by resistors R3 and R11 to the positive input of the operational amplifier 50 of the pulse amplifier 34. The op amp 50 is arranged in a high gain mode by a resistive feedback network formed by resistors R12 and R13. The amplified pulse train produced at the output of the op amp 50 is applied to the negative input of the operational amplifier 48 of the pulse detector 28. The filtered and amplified pulse train P received at at the negagive input is compared by the op amp 48 to a positive voltage level reference signal S3 that is established at a level between the low and high voltage reference signals S1, S2 at the positive terminal of the op amp 48 by a resistive voltage divider network formed by resistors R14 and R15. When the level of pulsed voltage signal P increases above the level of the positive reference signal S3, the output of the op amp 48 switches from a high state to a low state. Conversely, when the level of the pulsed voltage signal P applied at the negative input decreases below the level of the reference signal S3 applied to the positive input, then the output of the op amp 48 switches from the low state back to high state.

The outputs of the low level detector 24, high level detector 26 and pulse detector 28 are connected via conductors 52, 54 and 56 to an indicator driver 58 which, in turn, is connected to the red first LED indicator 30. The indicator driver 58 receives and amplifies the output signals of the detectors 24, 26, 28. Such amplification provide maximum brightness of the red illumination produced by the first LED indicator 30 when any one of the output signals is at the low state which is the state that turns on the first LED indicator 30. The values of the resistors R16, R17 and R18 of the indicator driver 58 are selected to provide substantially equal drive voltage to a transistor Q1 of the indicator driver 58 from each of the detectors 24, 26 and 28. It is transistor Q1 of the driver 58 that serves to amplify the output signals from the detectors to provide maximum brightness of the red LED indicator 30. Thus, the red LED indicator 30 will visually show a first condition in the form of bright red illumination when the operation of the sensor 12 under test is satisfactory and a second condition in the form of no illumination when the operation of the sensor 12 under test is unsatisfactory. In the case of low state outputs from the low and high level detectors 24, 26, the illumination will be constant. In the case of low state output from the pulse detector 28, the illumination will be flashing or blinking.

When the third conductor 18 (or input signal test lead) is not connected or is isolated from the first and second conductors 14, 16 by considerable resistance, the outputs of the detectors 24, 26, 28 are held at high states by the various resistive voltage divider networks at their inputs. Also, it should be mentioned that the normal setting of the variable resistor R10 will hold the output of the low level detector 24 at a high state and keep the red LED indicator 30 off for sensors with a coil resistance of 220 ohms or higher connected between the first and third conductors 14, 18. This setting is useful for most sensors, and adjustment of the setting will be needed infrequently and only if sensors of unusually low resistance are to be tested.

Referring now to FIGS. 4, 5, 6 and 7, there are shown four different self-explanatory flow charts 60, 62, 64 and 66 of the steps to take and questions to ask oneself in using the sensor testing apparatus 10 to respectively test magnetic, photoelectric, impact, and proximity sensors. Since the flow charts 60, 62, 64 and 66 are meant to be self-explanatory, they need not be described in detail herein. Only a few observations will be made below concerning use of the apparatus 10 in testing the different categories of sensors. Also, in FIG. 8, there is depicted a diagram of the connections between the black (B), red (R) and green (G) test conductors 14, 16 and 18 of the sensor testing apparatus 10 and the different categories of sensors as well as other devices which can be tested with the apparatus 10.

Before commencement of testing of sensors, the testing apparatus 10 itself must be tested to ensure that it is in normal operation order. After power is switched on by manipulating the on/off switch 36 and checking to ensure that none of the test conductors 14, 16 and 18 are touching each other, the green LED indicator 38 should be on and the red LED indicator 30 should be off. First, touch the clip on the green test conductor 18 to the clip on the red test conductor 16, and then to the clip on the black test conductor 14. In both cases, the red LED indicator 30 should come on while the two clips are touching, and the green LED indicator 38 should remain on at all times. Next, briefly touch the black and red test conductors 14 and 16 to each other. The green LED indicator 38 should go off, which indicates a short circuit between the power and ground conductors. After properly passing these quick operational checks, the testing apparatus 10 is ready for use.

Figure 4:
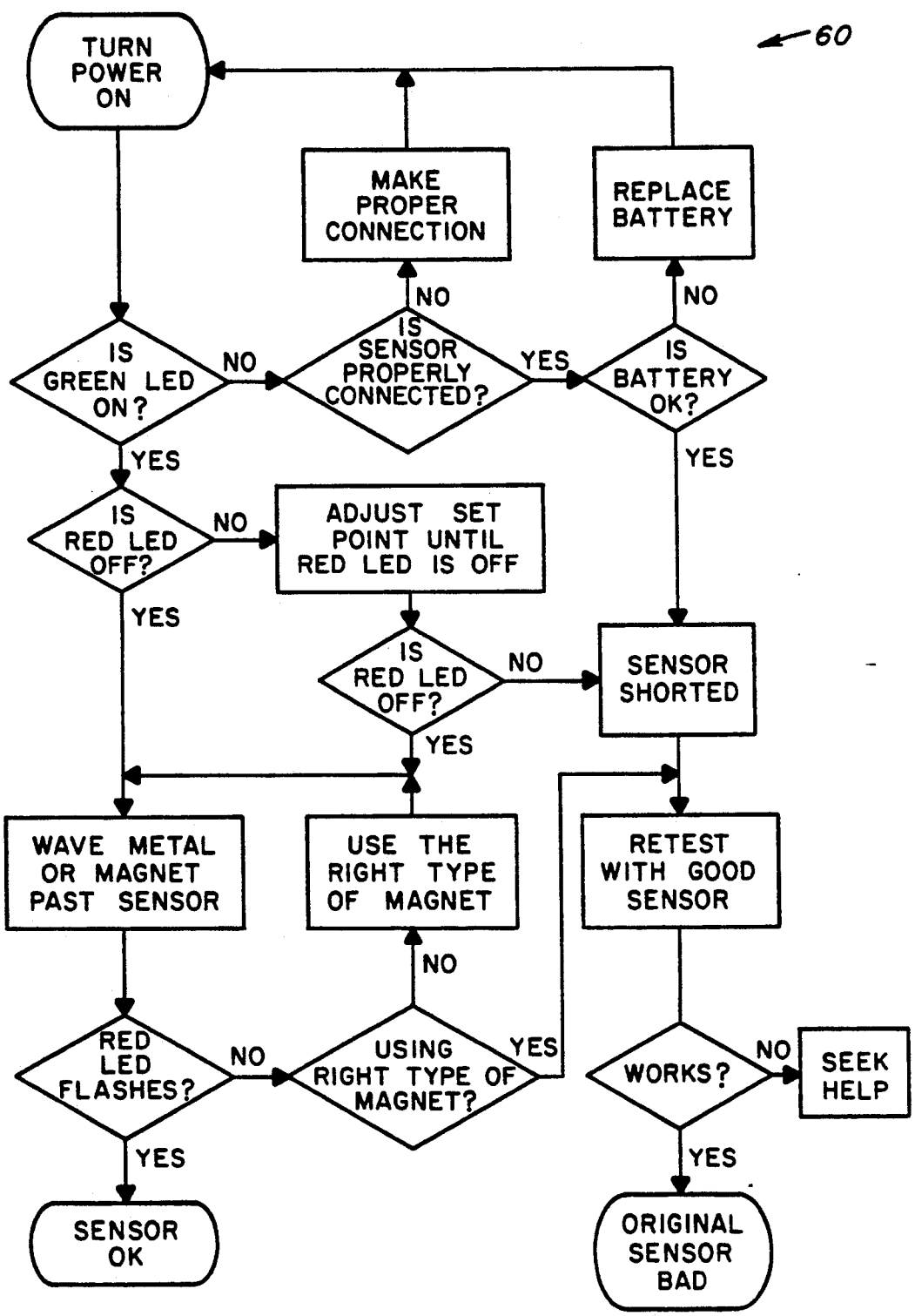
FIG. 4 is a flow chart of the steps in using the sensor testing apparatus to test magnetic sensors.

To test a magnetic sensor 12A (FIG. 8), the respective connections of the black first conductor 14 and of the green third conductor 18 to the sensor 12A are completed first. The red second conductor 16 is not used for this application. The self-explanatory flow chart 60 of FIG. 4 is then followed to carry out the test and interpret the results. As noted in the flow chart 60, the sensor 12A is operating satisfactory if the red LED indicator 30 flashes on whenever the sensor 12A is passed near ferrous metal or a magnet. The sensor 12A is defective or inoperative if, instead, the red LED indicator 30 never comes on meaning that an open circuit condition exists in the sensor 12A or always stays on meaning that the sensor is shorted out.

An observation about this test is that the operator must keep in mind that a magnetic sensor that picks up the movement of a plain metal object will have a magnet built into it, whereas a sensor that uses a magnet for a target will not. Thus, for testing a magnetic sensor that uses a magnetic target, a separate magnetic must be supplied for use in testing the sensor with the testing apparatus 10.

Another observation is that in testing a magnetic sensor it is important to first consider what is the resistance of its coil. As mentioned above, the sensor testing apparatus 10 is set up (factory calibrated) to check magnetic sensors with a coil resistance of over 220 ohms. If a magnetic sensor with a resistance below 220 ohms is connected to the testing apparatus 10, the red LED indicator 30 will come on and stay on, making a test impossible. The set point of the testing apparatus 10 is made adjustable, via the adjustable resistor R10, to compensate for this situation. To adjust the set point, a screwdriver must be used to turn a screw (not shown) that is located in the battery compartment and connected to the adjustable resistor R10. With the testing apparatus 10 connected to the sensor under test, the screw is turned until the red LED indicator 30 goes out. After replacing the battery, the test of the sensor may be performed in the normal manner. If decreased sensitivity is now noticed upon testing higher resistance magnetic sensors, then it may be necessary to readjust the set point again after the low resistance sensor has been tested.

Figure 5:
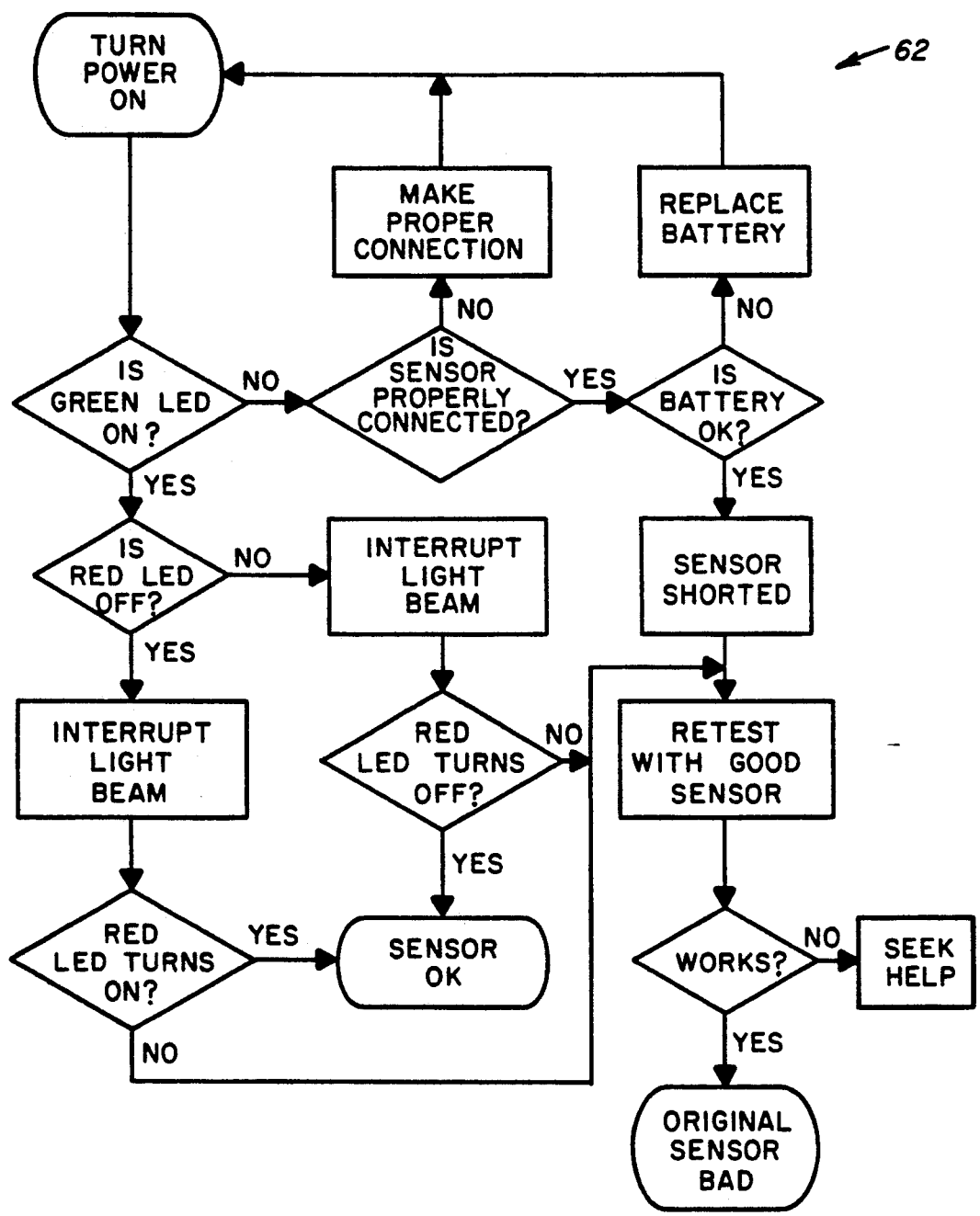
FIG. 5 is a flow chart of the steps in using the sensor testing apparatus to test photoelectric sensors.

To test a photoelectric sensor 12B (FIG. 8), the respective connections of the black first conductor 14, of the red second conductor 16, and of the green third conductor 18, to the sensor 12B are completed first. The self-explanatory flow chart 62 of FIG. 5 is then followed to carry out the test and interpret the results. As noted in the flow chart 62, the photoelectric sensor 12B is operating satisfactory if the red LED indicator 30 is on but then goes out whenever the beam of the sensor 12B is blocked. However, some sensors work in the opposite way.

One observation about this test is that there are several problems that can affect the operation of photoelectric sensors 12B, such as loss of the light source, failure of the sensor itself, or failure of the associated electronic circuit. It is important to remember that a photoelectric sensor 12B with a bad light source may still operate normally in strong sunlight, so testing in subdued light is a good practice.

Another observation is that it will be necessary to use black electrical tape to block the beam of many sensors, as they are capable of "seeing" through or around objects such as fingers. Thus, always use tape in the final test before condemning a sensor as defective. In the case of planter seed tubes this may not be possible, but seed tube sensors can usually be triggered with a seed tube brush or some similar object.

Figure 6:
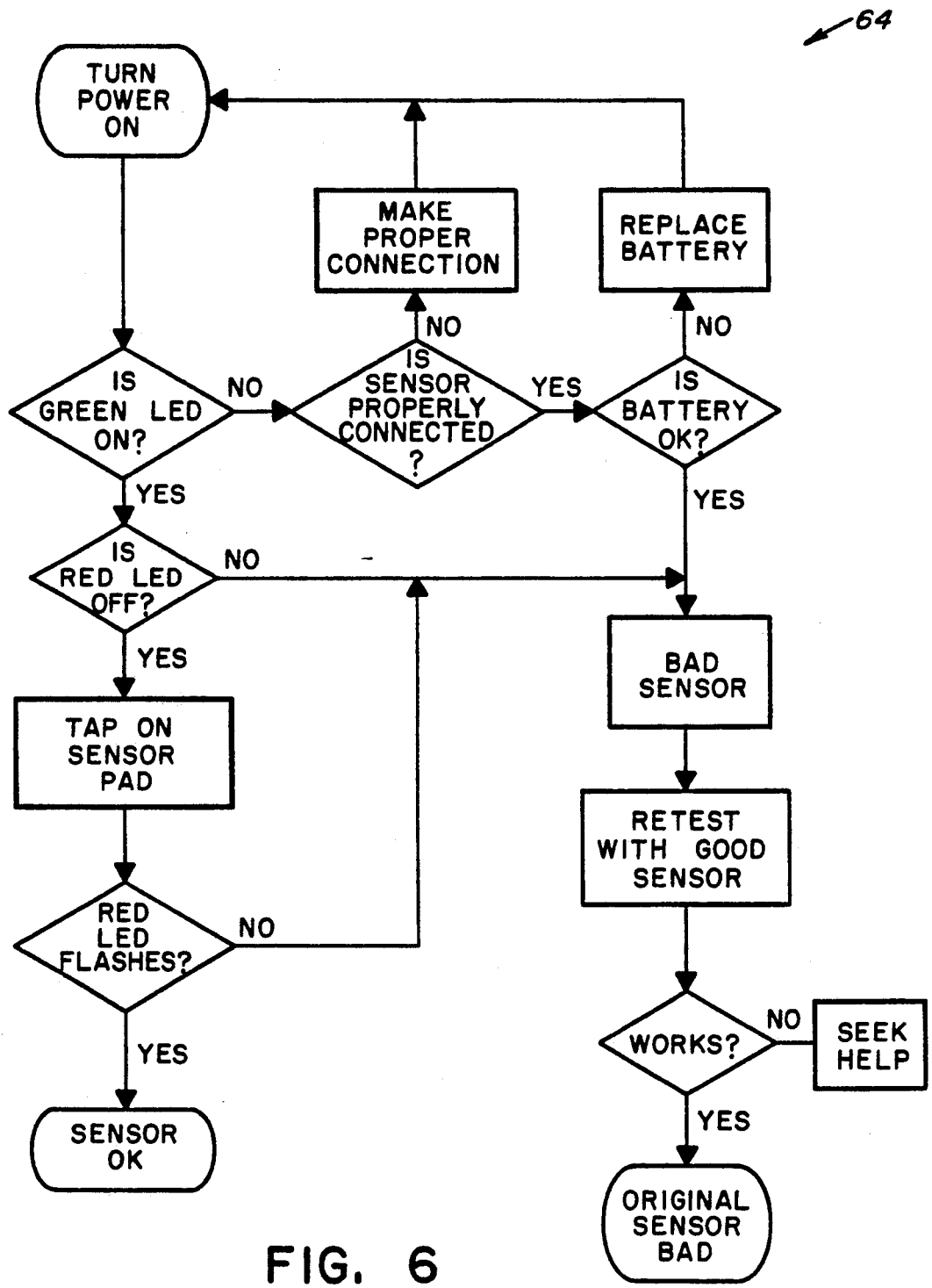
FIG. 6 is a flow chart of the steps in using the sensor testing to test impact sensors.

To test an impact sensor 12C (FIG. 8), the respective connections of the black first conductor 14 and of the green third conductor 18 to the sensor 12C are completed first. The red second conductor 16 is not used for this application. The self-explanatory flow chart 64 of FIG. 6 is then followed to carry out the test and interpret the results. As noted in the flow chart 64, the impact sensor 12C is operating satisfactory if the red LED indicator 30 flashes on whenever the pad of the sensor 12C is tapped. If more than a light tap is needed, the sensor 12C is probably weak and may need to be replaced. Compare with a good sensor to determine whether the sensor under test is defective or inoperative.

An observation about this test is that the same consideration to internal resistance applies in the case of impact sensors 12C as in the case of magnetic sensors 12A. However, internal resistance of impact sensors 12C tend to have much higher resistance and ,so adjust of the set point will usually not have to be made for this test.

Another observation is that the impact sensor 12C can be tapped with a screwdriver or other hard object to simulate normal operation. Testing a known good sensor will help to give the feel of how to strike the sensor for good results.

Figure 7:
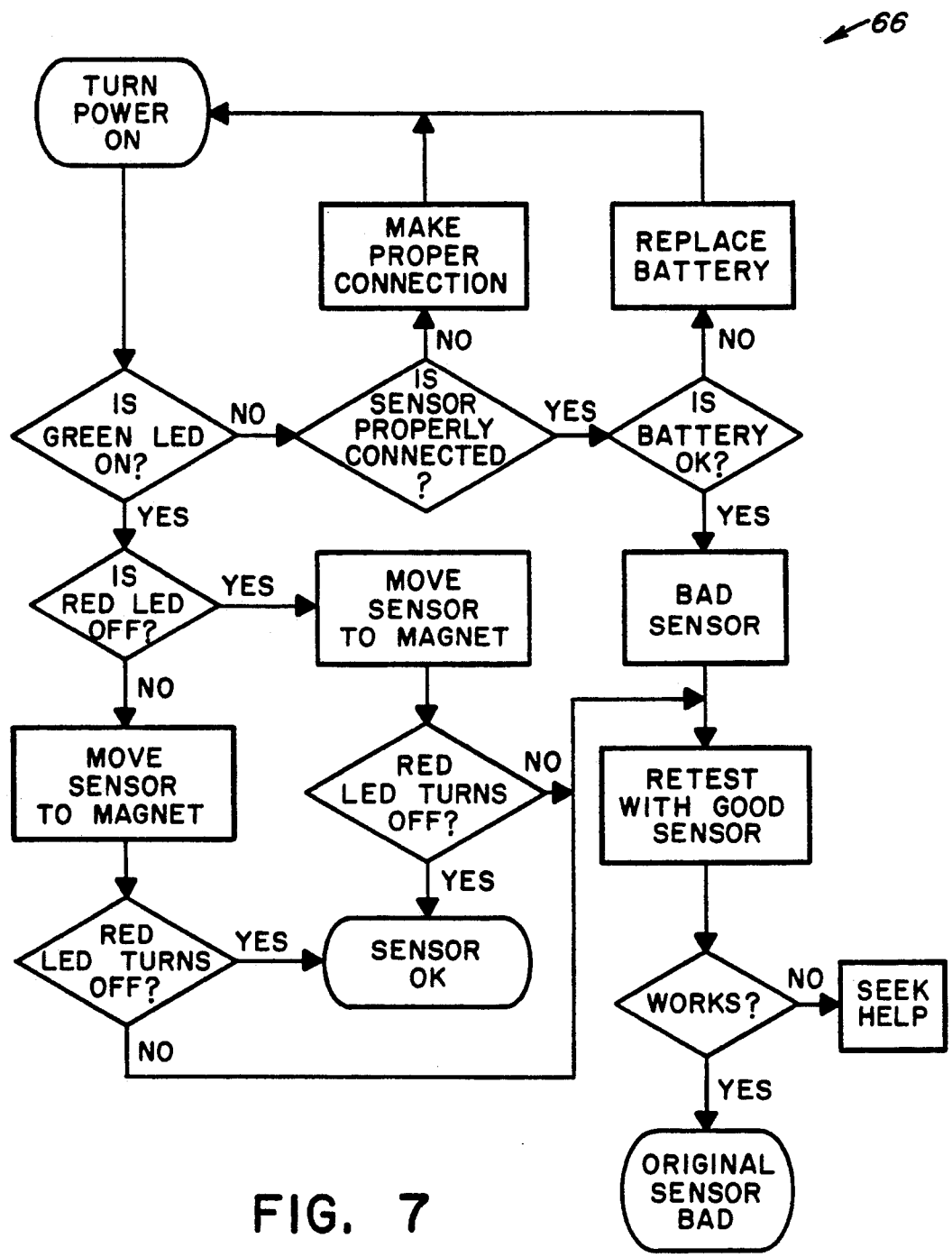
FIG. 7 is a flow chart of the steps in using the sensor testing apparatus to test proximity sensors.

To test a proximity (or Hall Effect) sensor 12D (FIG. 8), the respective connections of the black first conductor 14, of the red second conductor 16, and of the green third conductor 18, to the proximity sensor 12D are completed first. The self-explanatory flow chart 66 of FIG. 7 is then followed to carry out the test and interpret the results. As noted in the flow chart 66, the proximity sensor 12D is operating satisfactory if the red LED indicator 30 changes its condition whenever placed next to the proper size magnet, regardless of whether the LED indicator 30 was on or off before being placed next to the magnet.

An observation about this test is that proximity sensors 12D change their electrical characteristics when exposed to a magnet. The voltage at the green signal conductor 18 will change as the proximity sensor 12D is moved toward and away from the magnet, causing the red LED indicator 30 to go on and off accordingly.

These sensors must be tested using a magnet of a strength equivalent to that of the standard equipment magnetic target.

Figure 8:
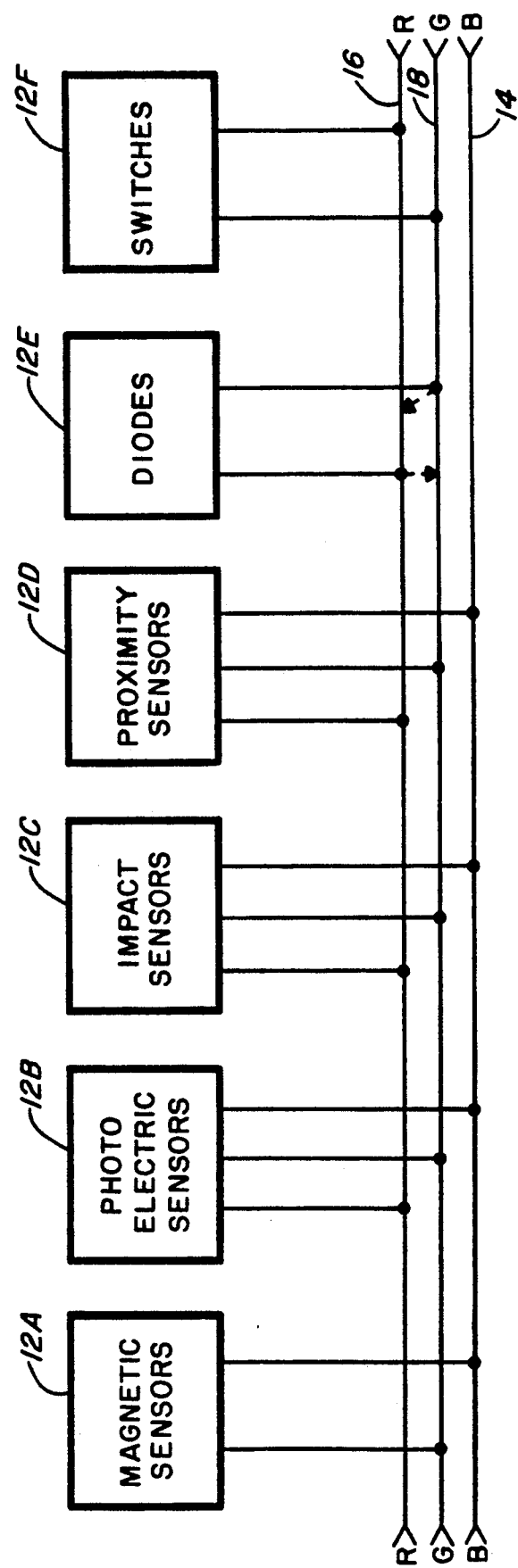
FIG. 8 is a diagram illustrating the connections between the sensor testing apparatus and the different categories of sensors.

To test diodes 12E or switches 12F, as shown in FIG. 8 the respective connections of the red second conductor 16 and of the green third conductor 16 to the respective diode 12E or switch 12F are completed first. The diode 12E is operating satisfactory if the red LED indicator 30 turns on with the diode connected one way but not when reversed. The arrows in FIG. 8 direct the operator to connect the red and green conductors 16 and 18 one way to the diode 12E and then reverse them. The red LED indicator 30 stays on if the diode 12E is shorted or never comes on if the diode 12E has an open circuit condition. The switch 12F is operating satisfactorily if the red LED indicator 30 turns on with the switch 12F closed. The red and green conductors 16 and 18 can be connected either way to the switch 12F.

A final observation regarding connections of the black, red and green conductors 14, 16 and 18 to a sensor to be tested is that the testing apparatus 10 is designed so that it will not be damaged by any combination of connections, nor will it cause damage to most common sensors even if it is hooked up wrongly. Still, it is very important to be sure what the connections should be properly made so as to avoid possibility of unforeseen damage occurring if improper connections are made.

It is thought that the present invention and its advantages will be understood from the foregoing description and it will be apparent that various changes may be made thereto without departing from its spirit and scope of the invention or sacrificing all of its material advantages, the form hereinbefore described being merely preferred or exemplary embodiment thereof.

Having thus described the invention, what is claimed is:

1. An apparatus for testing different electrical sensors, comprising:
    (a) means for providing a ground voltage signal;
    (b) first conductor means connected to said ground voltage signal providing means and connectible to a sensor under test for conducting the ground voltage signal to the sensor under test;
    (c) means for supplying a positive voltage signal;
    (d) second conductor means connected to said positive voltage signal supplying means and connectible to a sensor under test for conducting the positive voltage signal to the sensor under test;
    (e) third conductor means connectible to the sensor under test for receiving and conducting a voltage signal from the sensor under test;
    (f) first detector means connected in series to said voltage signal conducting third conductor means for receiving the sensor voltage signal from said third conductor means, comparing the sensor voltage signal to a ground voltage reference signal, and producing an output signal of a first state when the sensor voltage signal is less in magnitude than the ground voltage reference signal and of a second state when the sensor voltage signal is greater in magnitude than the ground voltage reference signal;
    (g) second detector means connected in series to said voltage signal conducting third conductor means and in parallel with said first detector means for receiving the sensor voltage signal from said third conductor means, comparing the sensor voltage signal to a first positive voltage reference signal, and producing an output signal of a first state when the sensor voltage signal is greater in magnitude than the first positive voltage reference signal and of a second state when the sensor voltage signal is less in magnitude than the first positive voltage reference signal;
    (h) third detector means connected in series to said third conductor means and in parallel with said first detector means and second detector means for receiving the sensor voltage signal from said third conductor means, comparing the sensor voltage signal to a positive voltage reference signal, and producing an output signal of a first state when the sensor voltage signal is a train of individual pulses produced by a sensor under test and the individual pulses are greater in magnitude than a second positive voltage reference signal being between the ground voltage reference signal and the first positive voltage reference signal and of a second state when the individual pulses are less in magnitude than the second positive voltage reference signal; and
    (i) means for indicating a first condition when the operation of the sensor under test is satisfactory and a second condition when the operation of the sensor under test is unsatisfactory, said indicating means being connected to said first detector means, second detector means, and third detector means, for receiving the output signals therefrom and indicating the first condition when any one of the output signals is of the first state and indicating the second condition when all output signals are of the second state.

2. The apparatus of claim 1 wherein said indicating means includes a light emitting diode which in said first condition is turned on in response to receiving any one output signal of the first state and which in said second condition is turned off in response to receiving all output signals of the second state.

3. The apparatus of claim 2 further comprising: means connecting each of said first detector means, second detector means and third detector means in series with said light emitting diode for receiving and amplifying the output signals to provide maximum brightness of said light emitting diode when any one output signal is of the first state in which said light emitting diode is turned on.

4. The apparatus of claim 1 wherein said first detector means is an operational amplifier having a positive input connected to the sensor voltage signal, a negative input connected to the ground voltage reference signal, and an output connected to said indicating means.

5. The apparatus of claim 1 wherein said second detector means is an operational amplifier having a negative input connected to the sensor voltage signal, a positive input connected to the first positive voltage reference signal, and an output connected to said indicating means.

6. The apparatus of claim 1 wherein said third detector means includes a pulse filter, pulse amplifier and a pulse detector for receiving the sensor voltage signal, comparing the sensor voltage signal to the second positive voltage reference signal and producing an output signal of the first or second state.

7. The apparatus of claim 6 wherein said pulse detector is an operational amplifier having a negative input connected to the input voltage signal, a positive input connected to the positive voltage reference signal, and an output connected to said indicating means.

8. The apparatus of claim 1 further comprising:
an on/off switch connected between said positive voltage signal supplying means and said second conductor means and being operable between "on" and "off" positions to respectively connect said positive voltage signal supplying means to or disconnect said positive voltage signal supplying means from said second conduct or means.

9. The apparatus of claim 8 further comprising:
means connected to said on/off switch for indicating whether said on/off switch is said "on" or "off" position.

* * * * *